United States Patent
Choi

(10) Patent No.: US 6,566,173 B1
(45) Date of Patent: *May 20, 2003

(54) POLYCRYSTALLINE SILICON THIN FILM TRANSISTOR AND MANUFACTURING METHOD THEREOF

(75) Inventor: Jaebeom Choi, Taecheon (KR)

(73) Assignee: LG Philips LCD Co., Ltd., Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/528,030

(22) Filed: Mar. 17, 2000

(30) Foreign Application Priority Data

Mar. 18, 1999 (KR) .............................. 99-09220

(51) Int. Cl.[7] .......................... H01L 21/00; H01L 21/84
(52) U.S. Cl. ...................... 438/149; 438/482; 438/487; 438/488; 438/489; 257/52; 257/63; 257/64; 257/66; 349/42; 349/43
(58) Field of Search ................... 438/149, 482, 438/487–89; 257/52–66, 68; 349/1, 42–43

(56) References Cited

U.S. PATENT DOCUMENTS

| | | | | |
|---|---|---|---|---|
| 4,917,467 A | * | 4/1990 | Chen et al. | 350/332 |
| 5,550,066 A | * | 8/1996 | Tang et al. | 437/40 |
| 5,744,820 A | * | 4/1998 | Matsushima et al. | 257/59 |
| 5,793,460 A | * | 8/1998 | Yang | 349/148 |
| 5,917,210 A | * | 6/1999 | Huang et al. | 257/292 |
| 5,940,151 A | * | 8/1999 | Ha | 349/43 |
| 5,969,779 A | * | 10/1999 | Kim et al. | 349/54 |
| 5,995,175 A | * | 11/1999 | Kim et al. | 349/43 |
| 6,107,641 A | * | 8/2000 | Mei et al. | 257/66 |
| 6,166,785 A | * | 12/2000 | Ha | 349/42 |
| 6,191,835 B1 | * | 2/2001 | Choi | 349/106 |
| 6,194,740 B1 | * | 2/2001 | Zhang et al. | 257/59 |
| 6,204,520 B1 | * | 3/2001 | Ha et al. | 257/72 |

FOREIGN PATENT DOCUMENTS

| | | | | |
|---|---|---|---|---|
| JP | 0546198 b1 | * | 6/1992 | G02F/1/335 |
| JP | 7-45832 | * | 2/1995 | H01L/29/78 |

* cited by examiner

*Primary Examiner*—Matthew Smith
*Assistant Examiner*—Granvill D Lee, Jr.
(74) *Attorney, Agent, or Firm*—Birch, Stewart, Kolasch & Birch, LLP

(57) ABSTRACT

The present invention discloses a polycrystalline silicon thin film transistor connected to a gate line and a data line that includes a source electrode contacting the data line; a gate electrode contacting the gate line; a drain electrode spaced apart from the source electrode; a polysilicon layer positioned between and contacting the source and the drain electrodes, and acting as a channel area in which electrons flow; at least one metal layer positioned near the polysilicon layer and parallel to a flow direction of the electrons; and a buffer layer interposed between the metal layer and the polysilicon layer.

12 Claims, 3 Drawing Sheets

POLYCRYSTALLINE SILICON THIN FILM TRANSISTOR AND MANUFACTURING METHOD THEREOF

CROSS REFERENCE

This application claims the benefit of Korean Patent Application No. 1999-09220, filed on Mar. 18, 1999, under 35 U.S.C. § 119, the entirety of which is hereby incorporated by reference.

BACKGROUND OF THE INVENTION

1. Field of the invention

The present invention relates to a thin film transistor (TFT), and more particularly, to a polycrystalline silicon thin film transistor (Poly-Si TFT) and a method of manufacturing the same.

2. Description of Related Art

Conventional polycrystalline silicon thin film transistors (hereinafter referred to simply as "Poly-Si TFTs") are commonly employed in high-density static random access memory cells (SRAMs) for load pull-up devices, as well as used both as switching elements and as peripheral driver circuitry in large-area active-matrix liquid crystal displays (LCDs).

FIG. 1 is a plan view illustrating a typical Poly-Si TFT of a coplanar type. As shown in FIG. 1, a data line BB is arranged in a longitudinal direction and a gate line GB is arranged in a transverse direction perpendicular to the data line BB. A source electrode 18a is extended from the data line BB, and a drain electrode 18b is spaced apart from the source electrode and contacts with a pixel electrode (not shown). A gate electrode 17 is extended from the gate line GB. A polycrystalline silicon layer 13 is arranged as an active layer between the source and drain electrodes 18a and 18b nearby the cross point of the data line BB and the gate line GB.

FIG. 2 is a cross-sectional view taken along line II—II' of FIG. 1. Referring to FIG. 2, the conventional Poly-Si TFT is manufactured as follows. An amorphous silicon (a-Si) is first deposited on a transparent insulating substrate 11, heat-treated for crystallization through a furnace annealing technique or a laser annealing technique, and then patterned to form a polycrystalline silicon layer 13. A gate oxidation film 15, a gate electrode 17, source and drain electrodes 18a and 18b, and an interlayer insulating film 19 are sequentially formed using self-align technology.

Electric characteristics of the Poly-Si TFT described above mainly depend on the polycrystalline silicon layer 13 that is an active area. The polycrystalline silicon layer 13 of the Poly-Si TFT formed through the above described method has a higher carrier mobility than amorphous silicon, but also has a substantially higher defect density than the single crystal silicon layer because it includes a large number of grain boundaries randomly arranged and, therefore the grain boundaries prevent carriers from flowing along the channel. As a result, the Poly-Si TFT tends to have a bad electric characteristic such as low carrier mobility.

SUMMARY OF THE INVENTION

An object of the present invention is to provide a Poly-Si TFT having the polycrystalline silicon layer as an active area in which grain boundaries thereof are uniformly arranged to be parallel to the channel direction in which electrons flow.

In order to achieve the above object, the present invention, in a first aspect, provides a polycrystalline silicon thin film transistor connected to a gate line and a data line, including a source electrode contacting the data line; a gate electrode contacting the gate line; a drain electrode spaced apart from the source electrode; a polysilicon layer positioned between and contacting the source and the drain electrodes, and acting as a channel area in which electrons flow; at least one metal layer positioned near the polysilicon layer and parallel to a flow direction of the electrons; and a buffer layer interposed between the metal layer and the polysilicon layer.

The metal layer is entirely overlapped with the polysilicon layer, or is partially overlapped with the polysilicon layer.

The present invention, in another aspect, provides a polycrystalline silicon thin film transistor connected to a gate line and a data line, including a substrate; at least one metal layer parallel to the gate line on the substrate; a first insulating layer covering the at least one metal layer and the exposed substrate; a polysilicon layer on the first insulating layer; a source electrode contacting the polysilicon layer and the data line; a drain electrode spaced apart from the source electrode and contacting the polysilicon layer; a second insulating layer on the polysilicon layer; and a gate electrode on the second insulating layer and connected to the gate line.

The present invention, in another aspect, further provides a method of forming a polysilicon layer which is used as a channel of a thin film transistor, including the steps of: forming at least one metal layer parallel to the channel direction; forming an insulating layer covering the metal layer; forming an amorphous silicon layer on the insulating layer; and heat treating the amorphous silicon layer, thereby converting the amorphous silicon layer into a polysilicon layer.

The heat treating process is done by a laser annealing technique.

The foregoing and other objectives of the present invention will become more apparent from the detailed description given hereinafter. However, it should be understood that the detailed description and specific examples, while indicating preferred embodiments of the invention are given by way of illustration only, since various changes and modifications within the spirit and scope of the invention will become apparent to those skilled in the art from this detailed description.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Reference will now be made in detail to the preferred embodiment of the present invention, example of which is illustrated in the accompanying drawings.

Figure 1:
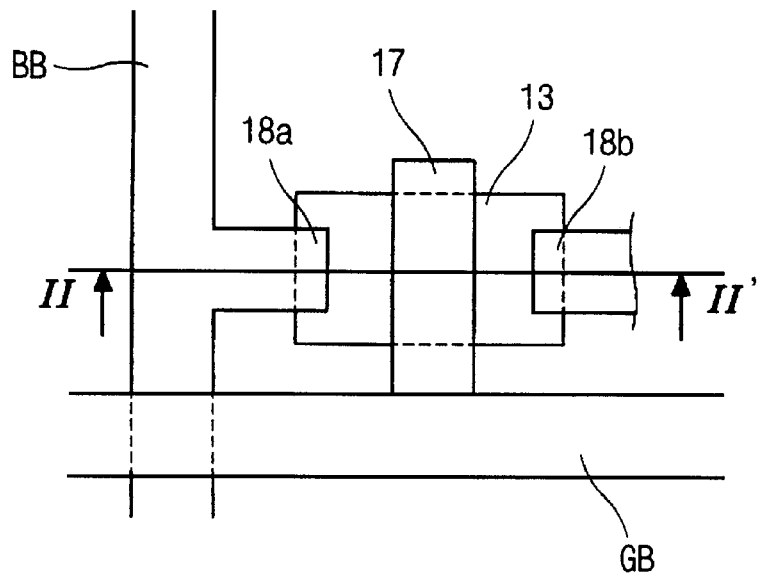
FIG. 1 is a plan view illustrating a typical polycrystalline silicon thin film transistor of a coplanar type.
Figure 2:
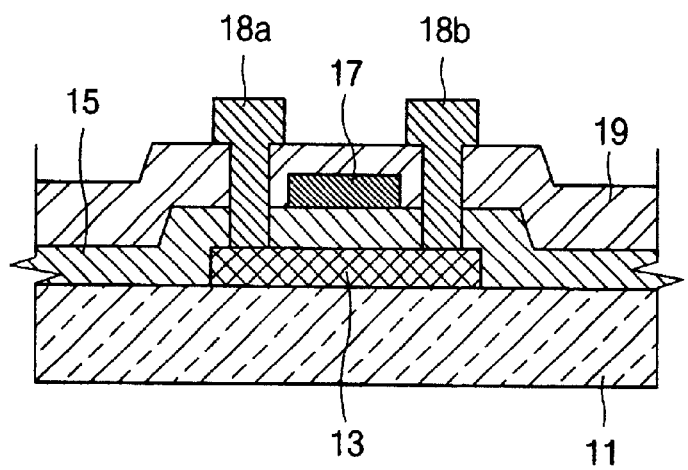
FIG. 2 is a cross-sectional view taken along line II—II' of FIG. 1.
Figure 3:
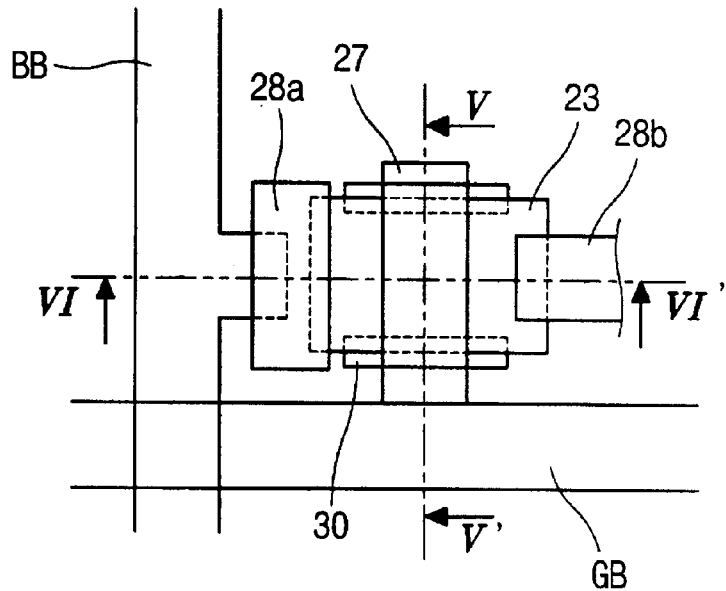
FIG. 3 is a plan view illustrating a polycrystalline silicon thin film transistor according to a preferred embodiment of the present invention.
Figure 4:
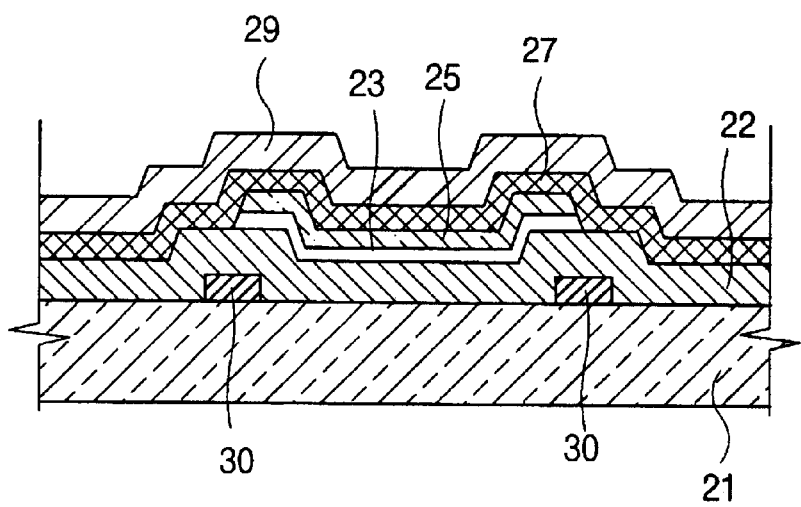
FIG. 4 is a cross-sectional view taken along line V—V' of FIG. 3.
Figure 5:
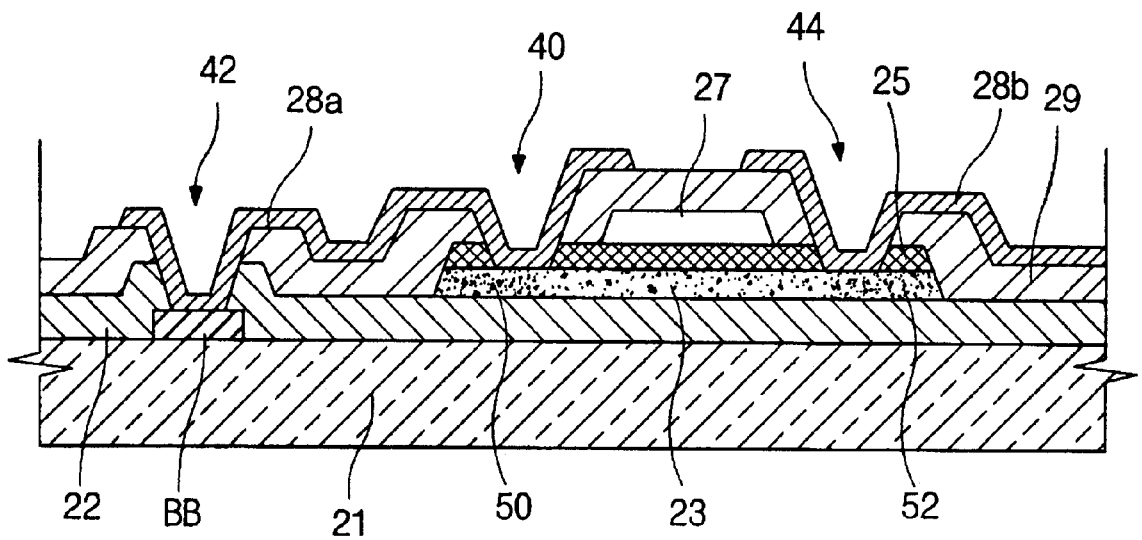
FIG. 5 is a cross-sectional view taken along line VI—VI' of FIG. 3.

FIG. 3 is a plan view illustrating a polycrystalline silicon thin film transistor according to a preferred embodiment of the present invention, and FIGS. 4 and 5 are cross-sectional views, respectively, taken along lines V—V' and VI—VI' of FIG. 3.

Referring to FIGS. 3 to 5, a structure of the Poly-Si TFT according to the preferred embodiment of the present invention will be explained in detail.

As shown in FIG. 3, a data line BB is arranged in a longitudinal direction and a gate line GB is arranged a transverse direction perpendicular to the data line BB. A source electrode 28a is extended from and contacts the data line BB, and a drain electrode 28b is spaced apart from the source electrode and contacts with a pixel electrode (not shown). A gate electrode 27 is extended to be perpendicular to the gate line G8. A polycrystalline silicon layer 23 is arranged as an active layer between the source and drain electrodes 28a and 28b nearby the cross point of the data line BB and the gate line GB.

As shown in FIGS. 4 and 5, the polycrystalline silicon layer 23 is formed over a transparent insulating substrate 21 with a buffer insulating layer 22 interposed therebetween. The gate electrode 27 is formed over the polycrystalline silicon layer 23 with a gate oxidation film 25 sandwiched therebetween. A passivation film 29 is formed on the gate electrode while covering the exposed portions of the substrate 21. Moreover, one end of the source electrode 28a of ITO (indium Tin Oxide) contacts with a source region 50 of the polycrystalline silicon layer 23 through a contact hole 40 and the other end of the source electrode 28a contacts with the data line BB through a contact hole 42. Also, the drain electrode 28b contacts with a drain region 52 of the polycrystalline silicon 23 through a contact hole 44.

Furthermore, in order to minimize the effect of grain boundaries of the polycrystalline silicon layer 23 on the electric carrier mobility, metal layers 30 capable of controlling the grain boundaries of the polycrystalline silicon layer 23 are formed under both sides of the polycrystalline silicon layer 23 such that electric carriers uniformly flow in a channel direction.

As shown in FIGS. 3 and 4, the metal layers 30 are preferably positioned such that they are entirely overlapped with the polycrystalline silicon layer 23. However, they may be arranged to be partially overlapped with the polycrystalline silicon layer 23 or not to be overlapped with the polycrystalline silicon layer 23 at all. The metal layers 30 are preferably extended parallel to the gate line GB. At this point, the metal layers 30 are simultaneously formed with the data line BB. And the metal layer 30 and the polycrystalline silicon layer 23 have the buffer insulating layer 22 interposed therebetween. Although in the drawings two metal layers are employed, only one metal layer can be used.

A process of manufacturing a Poly-Si TFT according to a preferred embodiment of the present invention will be hereinafter explained in detail.

First, the metal layer 30 and the data line BB are simultaneously formed on the transparent insulating substrate 21 made of a transparent material such as quartz or glass. Buffer insulating layer 22 of a silicon oxidation film or a silicon insulating layer or the like is then formed while covering the metal layer 30 and the data line BB. Sequentially, an amorphous silicon layer of a predetermined thickness is deposited on the buffer insulating layer 22 through a low pressure chemical vapor deposition (LPCVD) process or a plasma enhanced CVD (PECVD) process using $SiH_4$ or $Si_2H_6$ gas. The amorphous silicon layer deposited is heat-treated to form the polycrystalline silicon layer 23 using a solid phase crystallization method such a furnace annealing technique or a liquid phase crystallization method such as a laser annealing technique. However, instead of the solid phase crystallization method requiring a long time heat-treatment, the preferred embodiment of the present invention employs the liquid phase crystallization method such a laser annealing technique considering heat transfer due to the metal layers 30.

Figure 6:
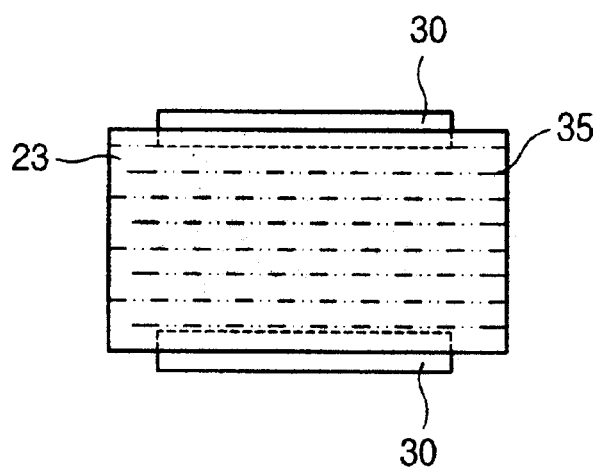
FIG. 6 is a view illustrating grain boundaries of a polycrystalline silicon layer controlled according to the preferred embodiment of the present invention.

At this point, as shown in FIG. 6, the grain boundaries of the polycrystalline silicon layer 23 become parallel with a longitudinal direction of the metal layer 30, i.e., a channel direction in which electrons flow, during crystallization process. This is because heat transfers fast in a channel direction due to the metal layer 30, leading to the grain boundaries uniformly arranged and parallel to the channel direction.

Sequentially, the gate silicon oxidation film 25 is formed on an active area of the polycrystalline silicon layer 23, and then a metal layer is deposited and patterned to form the gate electrode 27 through a lithography process and a dry etching process. Impurity ion gases are doped into the polycrystalline silicon layer 23 using the gate electrode 27 as a mask to define source and drain regions 50 and 52. At this point, the source and drain regions 50 and 52 become $n^+$-type when the doped ion gas is one of a nitrogen group, while the source and drain regions 50 and 52 become $p^+$-type when the doped ion gas is one of a boron group.

Then, the passivation film 29 is deposited over the entire substrate 21 and etched together with the gate silicon oxidation film 25 to form contact holes 40, 42 and 44, which are respectively formed on the data line BB and the source and drain regions 50 and 52. Further, ITO is deposited over the entire substrate 21 and patterned to form the source and drain electrodes 28a and 28b. The source electrode 28a contacts with the source region 50 and the data line 88, respectively, through contact holes 40 and 42, and the drain electrode 28b contacts with the drain region 52 through a contact hole 44. Therefore, substantially important components of the Poly-Si TFT are completed.

As described hereinbefore, since the Poly-Si TFT has a polycrystalline silicon layer as an active area in which the grain boundaries thereof are uniformly arranged to be parallel to the channel direction in which electrons flow, electric characteristic of the Poly-Si TFT such as electric carrier mobility can be much improved.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A polycrystalline silicon thin film transistor connected to a gate line and a data line, comprising:

a source electrode contacting the data line;

a gate electrode contacting the gate line;

a drain electrode spaced apart from the source electrode;

a polysilicon layer positioned between and contacting the source and the drain electrodes and acting as a channel area in which electrons flow;

at least one metal layer isolated from other conductive layers, separate from the gate electrode, positioned near the polysilicon layer and parallel to a flow direction of the electrons; and a buffer layer interposed between the metal layer and the polysilicon layer.

2. The thin film transistor of claim 1, wherein the polysilicon layer overlaps the entire metal layer.

3. The thin film transistor of claim 1, wherein the polysilicon layer overlaps a portion of the metal layer.

4. The thin film transistor according to claim 1, wherein said at least one metal layer comprises a pair of metal layers respectively positioned near opposing sides of the polysilicon layer and parallel to the flow direction of the electrons.

5. The thin film transistor according to claim 1, wherein the polysilicon layer comprises a plurality of grain boundaries that uniformly extend in a longitudinal direction substantially parallel to the flow direction of the electrons.

6. The thin film transistor according to claim 1, wherein the at least one metal layer is located between the substrate and the buffer insulating layer.

7. A polycrystalline silicon thin film transistor connected to a gate line and a data line, comprising:

a substrate;

at least one metal layer parallel to the gate line on the substrate;

a first insulating layer covering the at least one metal layer and the exposed substrate;

a polysilicon layer on the first insulating layer, the polysilicon layer being positioned near the at least one metal layer;

a source electrode contacting the polysilicon layer and the data line;

a drain electrode spaced apart from the source electrode and contacting the polysilicon layer;

a second insulating layer on the polysilicon layer; and a gate electrode, separate from said at least one metal layer, on the second insulating layer and connected to the gate line.

8. A method of forming a polysilicon layer which is used as a channel of a thin film transistor, comprising the steps of:

forming at least one metal layer isolated from other conductive layers and parallel to the channel direction;

forming an insulating layer converting the metal layer;

forming an amorphous silicon layer on the insulating layer; and heat-treating the amorphous silicon layer, thereby converting the amorphous silicon layer into a polysilicon layer.

9. The method of claim 8 wherein the heat treating process is done by a laser annealing technique.

10. The method of forming a polysilicon layer, according to claim 8, wherein said step of forming at least one metal layer comprises forming a pair of metal layers.

11. The method of forming a polysilicon layer, according to claim 8, wherein said step of heat-treating the amorphous silicon layer comprises forming a plurality of grain boundaries that extend in a longitudinal direction substantially parallel to the channel direction in the polysilicon layer.

12. The method of forming a polysilicon layer according to claim 8, wherein said step of forming a pair of metal layers comprises forming each of said pair of metal layers near opposing sides of the polysilicon layer.

* * * * *